(12) United States Patent
Hidaka

(10) Patent No.: US 6,479,360 B2
(45) Date of Patent: Nov. 12, 2002

(54) SEMICONDUCTOR DEVICE AND MANUFACTURING METHOD

(75) Inventor: Hajime Hidaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/917,710

(22) Filed: Jul. 31, 2001

(65) Prior Publication Data

US 2002/0028560 A1 Mar. 7, 2002

Related U.S. Application Data

(62) Division of application No. 09/477,818, filed on Jan. 5, 2000, now Pat. No. 6,291,873.

(30) Foreign Application Priority Data

Apr. 9, 1999 (JP) ............................................. 11-102604

(51) Int. Cl.[7] .............................................. H01L 21/336
(52) U.S. Cl. ...................... 438/330; 257/539; 438/703
(58) Field of Search ................................. 257/536–543, 257/577; 438/329–333, 364–365

(56) References Cited

U.S. PATENT DOCUMENTS

| | | | |
|---|---|---|---|
| 4,258,311 A | | 3/1981 | Tokuda et al. |
| 4,397,076 A | * | 8/1983 | Honnigford et al. .......... 29/571 |
| 5,466,959 A | | 11/1995 | Goerlach et al. |
| 5,883,417 A | | 3/1999 | Jao et al. |
| 5,955,774 A | | 9/1999 | Kang |
| 5,977,598 A | | 11/1999 | Chen et al. |
| 5,990,539 A | | 11/1999 | Conzelmann et al. |
| 6,207,574 B1 | * | 3/2001 | Lee ............................ 438/703 |

* cited by examiner

*Primary Examiner*—Matthew Smith
*Assistant Examiner*—Calvin Lee
(74) *Attorney, Agent, or Firm*—Volentine Francos, PLLC

(57) ABSTRACT

In a semiconductor device comprising a resistance element electrically connected to a bipolar transistor, the bipolar transistor is formed on a silicon substrate and a predetermined resistance element is formed on an insulation film formed on the bipolar transistor based on results of measurements monitored for this transistor, in such a manner that the semiconductor device has prescribed characteristics.

21 Claims, 4 Drawing Sheets

SEMICONDUCTOR DEVICE AND MANUFACTURING METHOD

CROSS REFERENCE TO RELATED APPLICATIONS

This is a divisional application of application Ser. No. 09/477,818, filed Jan. 5, 2000, and issued as U.S. Pat. No. 6,291,873, which is hereby incorporated by reference in its entirety for all purposes.

BACKGROUND OF THE INVENTION

Semiconductor devices constructed using bipolar transistors are inclined to have their base widths formed as thinly as possible in order to achieve high speeds.

FIG. 5 shows a related method of manufacturing a semiconductor device having a bipolar transistor. An embedded n+ layer 12 an n-epitaxial growth layer 14 are formed on a p-type silicon substrate 10 taken as a semiconductor substrate. A trench element separation insulation film 16 and a filed insulation film 18 are formed on the p-type silicon substrate 10. A silicon oxide film 11 is formed on the region forming the trench element separation insulation film 16, the field insulation film 18 and the bipolar transistor. A surface of the p-type silicon substrate 10 is then flattened. A contact hole is then formed at the silicon oxide film 11 on the n-type epitaxial growth layer. A polysilicon film is then formed on the entire surface of the p-type silicon substrate 10 using CVD (Chemical Vapor Deposition) techniques. Predetermined patterns can then be formed from the polysilicon film by subjecting the polysilicon film to photolithographic and etching. After this, impurities are injected into the p-type silicon substrate 10 in the following manner. An n-type impurity is injected into the polysilicon pattern connected to the n-type epitaxial growth layer 14. A p-type impurity is then injected at a polysilicon pattern constituting a base lead-out electrode. A prescribed impurity is then injected into a polysilicon pattern constituting a resistance element. The p-type silicon substrate 10 is then heated to a temperature of 900 to 1000° C. A collector n+ layer 20 diffused with n-type impurity is then formed at the n-type epitaxial growth layer 14 as a result of this heat treatment. Similarly, a base lead-out electrode 26 and a resistance element 24 having a prescribed resistance value formed at the silicon oxide film 11 as a result of this heat treatment. This situation is shown in FIG. 5(a).

Next, a silicon oxide film 28 is formed as an insulation film at the surface of the p-type silicon substrate 10. After this, an opening is formed at a prescribed region of the base lead-out electrode 26 using photolithographic and etching processes. Next, a silicon nitride film 30 is formed as an insulation film at the silicon oxide film 28 including the opening. A silicon nitride film side wall is then formed within the opening by etching. The silicon oxide film 11 is then removed from within the opening and a p-type epitaxial layer is formed at the p-type silicon substrate 10. This p-type silicon substrate 10 is then the base p layer 32. This situation is shown in FIG. 5(b). A polysilicon film including an n-type conductive impurity that becomes an emitter lead-out electrode 36 to be described later is formed on the surface of the silicon nitride film 30. Next, an emitter n+ layer 34 is formed at the p-type silicon substrate 10 using heat treatment. An emitter lead-out electrode 36 is then formed on the p-type silicon substrate 10 using photolithographic and etching processing, so that an npn transistor is formed as a result of the above processes. This situation is shown in FIG. 5(c).

After this, a protective pattern is formed for the silicon oxide film 38a on the resistance element 24. Next, polysilicon film not covered by the polysilicon oxide film 38a is injected with impurity ions. This ion injection is carried out in order to lower the resistance of contacts connecting interconnect formed afterwards and the resistance element. A silicon oxide film 42 is then formed on the surface of the p-type silicon substrate 10 as an insulation film. Next, a contact hole is formed at the silicon oxide film 42 using photolithographic and etching processing. This contact hole is used for electrically connecting the base lead-out electrode 26. emitter lead-out electrode 36, collector lead-out electrode 22 and resistance element 24 to interconnect formed afterwards. An interconnect plug 44 is then formed by burying the contact hole thus formed with a high fusion point metal such as tungsten. An aluminum alloy film constituting an interconnect film is then formed on the silicon oxide film 42 including the interconnect plug 44. Interconnect 46 is then formed by patterning this aluminum alloy film. After this, an insulation film 48 is formed as a protective film on the silicon oxide film 42 including the interconnect 46. This situation is shown in FIG. 5(d).

The width of the base film can therefore be made thin by controlling the thickness of the base p layer 32 and the diffusion of the emitter n+ film 34 in this manner.

However, in the aforementioned semiconductor device manufacturing method there is the fear that the width of the base layer will be formed in an uneven manner due to the p-type epitaxial layer being formed in a thin manner in order to increase speed. This kind of unevenness in the base layer width dramatically influences the amplification factor of the bipolar transistor. In order to suppress this influence, the value of the resistance element 24 required in bias regulation is adjusted in line with the amplification factor of the transistor. As a method of adjustment, there is provided a method where the resistance value of the resistance element 24 is adjusted using the position of a contact for connecting with the resistance element 24. This adjustment of the contact position is carried out by modifying the mask. However, in this method it is necessary to prepare a new mask for adjustment, and the range of adjustment of the resistance value is narrow. Further, the resistance element pattern is formed long beforehand in order to broaden the degree of freedom of setting the position of contact. Parasitic capacitance occurring between the resistance element pattern and the p-type silicon substrate 10 therefore increase and interconnect delays become more substantial.

SUMMARY OF THE INVENTION

The structure of the semiconductor device of the present invention comprises a circuit element formed on a semiconductor substrate and a resistance element, electrically connected to the circuit element and being formed on an inter-layer insulation film covering said circuit element.

Further, the resistance value of the resistance element can be set according to the characteristics of the circuit element.

In the present invention, the circuit element can be a bipolar transistor and bias regulation of the bipolar transistor can be carried out by the resistance element.

On the other hand, the method of manufacturing the semiconductor device of the present invention comprises the steps of: forming a circuit element on a semiconductor substrate; forming a first insulation film covering the circuit element; forming a contact hole for connecting. with an electrode of the circuit element in a first insulation film; forming an interconnect plug within the contact hole and a prescribed interconnect pattern on the first insulation film using a high fusion point metal film; forming a second insulation film covering the interconnect pattern; forming an opening in the second insulation film in such a manner that part of the interconnect pattern and part of the upper surface of the first insulation film are exposed; and forming a polysilicon film of a prescribed conductive impurity concentration and film thickness covering and extending over part of the interconnect pattern and part of the top surface of the first insulation film.

The polysilicon film can be formed using CVD techniques in such a manner as to control the film thickness and the impurity concentration of the polysilicon film.

In the present invention, the film thickness of the polysilicon film and the impurity concentration can be set based on the results of measurements taken of the characteristics of the circuit element prior to forming the polysilicon film.

The polysilicon film can therefore be formed using CVD techniques in such a manner as to control the film thickness and the impurity concentration of the polysilicon film.

In the present invention, the film thickness and the impurity concentration of the polysilicon film can be set based on the results of measurements taken of the characteristics of the circuit element prior to forming the polysilicon film.

DETAILED DESCRIPTION OF THE PREFERRED EMBODIMENTS

Figure 6:
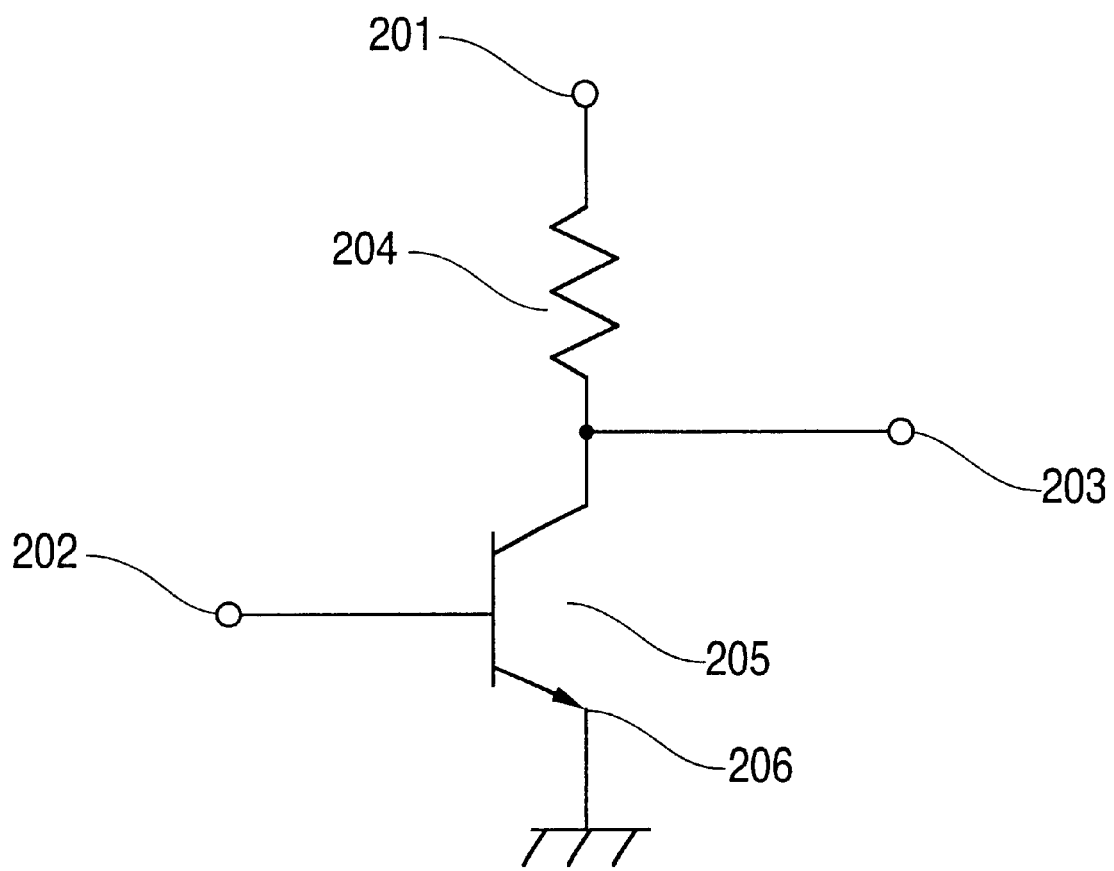
FIG. 6 is a circuit diagram of a basic circuit for configuring an example semiconductor device to which the first to fourth embodiments of the present invention are applied.

The following is a detailed description using the cross-sectional structural views of FIG. 1 to FIG. 4 of the embodiments of the present invention. A basic circuit taken as an example of a semiconductor circuit of the embodiments of the present invention is shown in FIG. 6. In FIG. 6, the collector of an npn bipolar transistor 205 that is the circuit element is connected to an output terminal 203. At the collector, a prescribed power supply voltage V is applied to a terminal 201 via a resistance element 204. The base of a bipolar transistor 205 is electrically connected to an input terminal 202 and an earth potential is applied to an emitter 206 of the bipolar transistor 205. With this circuit, when the input terminal 202 has a fixed range of variation, the current value (or voltage value) of the output terminal 203 is made to have a fixed range of variation. In order to fix the range of variation of the output terminal 203, setting and adjustment is carried out according to variations in the amplification factor of the bipolar transistor 205, i.e. the output of the output terminal 203 can be made small if the value of the resistance element 204 is made small. Further, the output of the output terminal 203 can be made large if the value of the resistance element 204 is made large.

FIG. 1 is a cross-sectional structural view showing the flow of a method of manufacturing the semiconductor device of the first embodiment of the present invention. The following is a description of the method of manufacturing the semiconductor device of the first embodiment of the present invention.

Figure 1A:
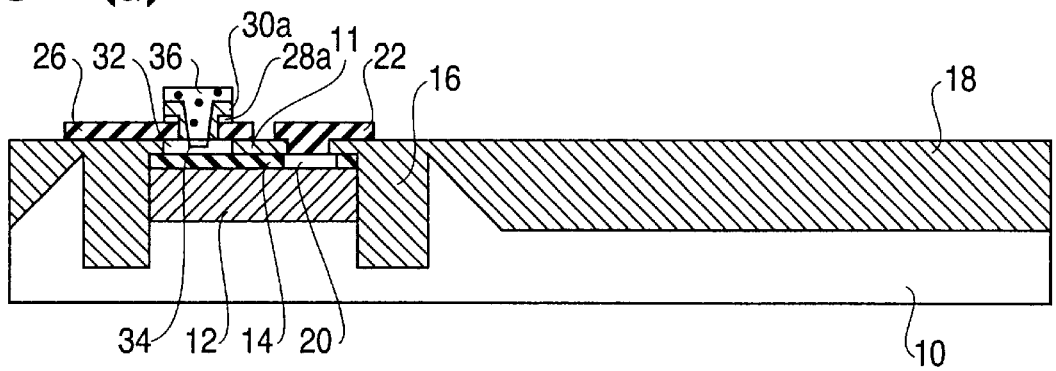
FIG. 1(a) through FIG. 1(c) are cross-sectional views showing the flow of a method for manufacturing a semiconductor device of a first embodiment of the present invention.

First, a bipolar transistor that is the circuit element shown in the related art is formed on a p-type substrate 10 that is the semiconductor substrate. This situation is shown in FIG. 1(a). The resistance element corresponding to the resistance element 24 of FIG. 5 is not formed in this step. Next, a silicon oxide film 42 that is the inter-layer insulation film is formed as the first insulation film on the bipolar transistor, the trench separation insulation film 16 and the field insulation film 18. A contact hole is then formed in the silicon oxide film 42 using photolithographic and etching processing. This contact hole is used for electrically connecting the base lead-out electrode 26, emitter lead-out electrode 36 and collector lead-out electrode 22 to an interconnect formed afterwards. A high fusion point metal layer of tungsten etc. is then formed within the contact hole and on the silicon oxide film 42. An interconnect plug 44 and interconnect 46 are then formed using a high fusion point metal film by photolithographic and etching processing. A TEG (Test Element Group) for monitoring the characteristics of the bipolar transistor is then formed at regions such as gridlines etc. that do not constitute the element, while constituting the bipolar transistor. Pads for measurement use (not shown) connected to electrodes of the TEG are then formed in a step for forming the interconnect plug 44 and the interconnect 46. After this, characteristics of the bipolar transistor are measured using this TEG for monitoring use. A resistance of the resistance element 204 is then obtained according to these results so that the output 203 of the circuit in FIG. 6 becomes a prescribed current or voltage. The interconnect plug 44 and interconnect 46 can also be formed separately.

Figure 1B:
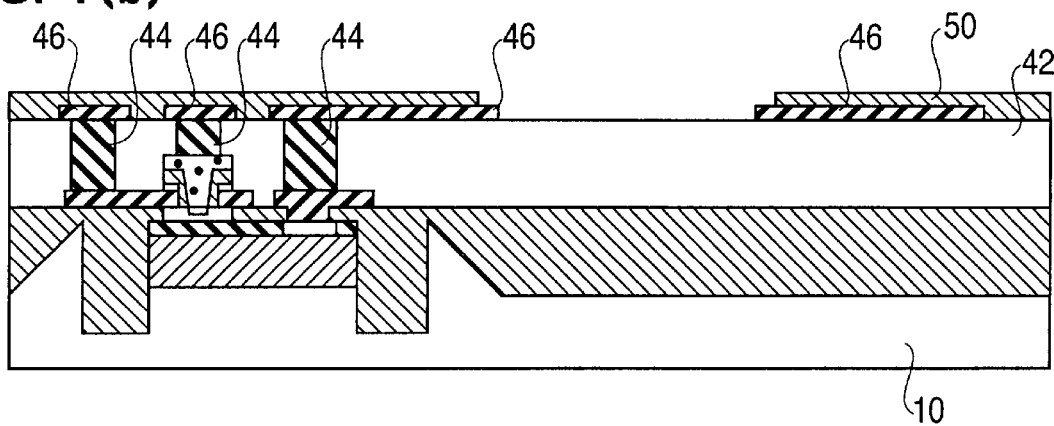

A silicon nitride film 50 is then formed on the silicon oxide film 42 including the interconnect 46 as a second insulating film. Next, a prescribed opening is formed at the silicon nitride film 50 using photolithographic and etching processing in such a manner as to expose the upper surface of the silicon oxide film 42. This opening is the region where the resistance element is formed. Part of the interconnect 46 is also exposed while forming this opening so that the resistance element thus formed can be electrically connected to the interconnect 46. This situation is shown in FIG. 1(b). Next, a polysilicon film including a p-type impurity as a conductive impurity is formed on the opening, the exposed part of the interconnect 46 and the silicon nitride film 50. This polysilicon film is formed by normal CVD techniques, while introducing a gas including a chemical element comprising a p-type impurity such as diborane into a treatment chamber and activating the impurities at a temperature of approximately 700° C. This polysilicon film is formed in such a manner as to be of a prescribed sheet resistance corresponding to the resistance obtained previously by the TEG for monitor use. The obtaining of a prescribed sheet resistance is possible by exerting control to give a prescribed impurity concentration and film thickness during forming of the polysilicon film. In this embodiment, the impurity concentration and film thickness for obtaining a prescribed sheet resistance can be obtained in advance using the TEG for monitoring used in resistance element evaluation.

Figure 1C:
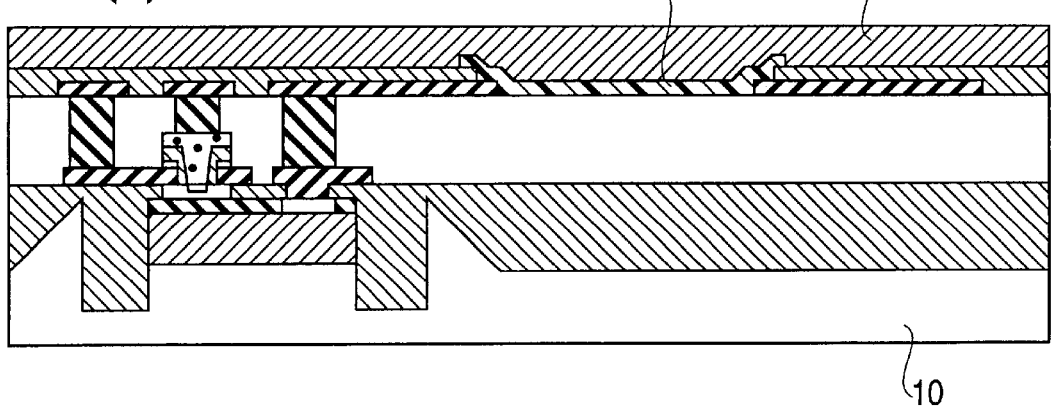

Next, the resistance element 24 of a prescribed pattern is formed by the polysilicon film using photolithographic and etching processing. An insulation film 48 is then formed as a protective film for providing resistance to moisture. This situation is shown in FIG. 1(c).

A detailed description will now be given of the method for setting the resistance. Generally, with a resistive body of length L, width W and film thickness (height) t, from parameters including a constant k decided by the film type and an impurity concentration N, the resistance R of this resistive body can be expressed by R=kL/tWN. The sheet resistance Rs of a polysilicon film is therefore $Rs\ t^{-1}N^{-1}$ and it can therefore be said that R Rs (L/W).

Of these parameters, the length L and the width W of the resistive body are decided according to the design and a mask is made in such a manner as to give a prescribed pattern. If the remaining parameters of film thickness t and impurity concentration N are then decided, a prescribed resistance R can be obtained. The sheet resistance Rs can therefore be controlled in the polysilicon film-forming step. The film thickness of the formed polysilicon film is relative to the treatment time and the borate concentration of the treatment atmosphere. A polysilicon film of a prescribed sheet resistance can therefore be formed by controlling the treatment time and borate concentration in the treatment atmosphere. Next, a resistance element of a prescribed resistance can be obtained by forming a resistive pattern of length L and width W using photolithographic and etching processing. It is also possible to fix one of either the film thickness or the impurity concentration, and then carry out control using other.

According to the method of this embodiment, resistance elements can be formed using low temperature heat treatment at approximately 700° C., compared with the 900 to 1000° C. for forming a related resistance element. As a result, the resistance element 24 can be formed after forming the transistor and then confirming the characteristics. The interconnect 46 is formed of a high fusion point metal film and the aforementioned heat treatment therefore does not pose any problems. Parasitic capacitance between the resistance element 24 and the substrate 10 can therefore be reduced because the distance between the substrate 10 and the resistance element 24 in a vertical direction with respect to the surface of the substrate 10 is increased. Investment can therefore be suppressed with this embodiment because a new mask is not required.

Figure 2:
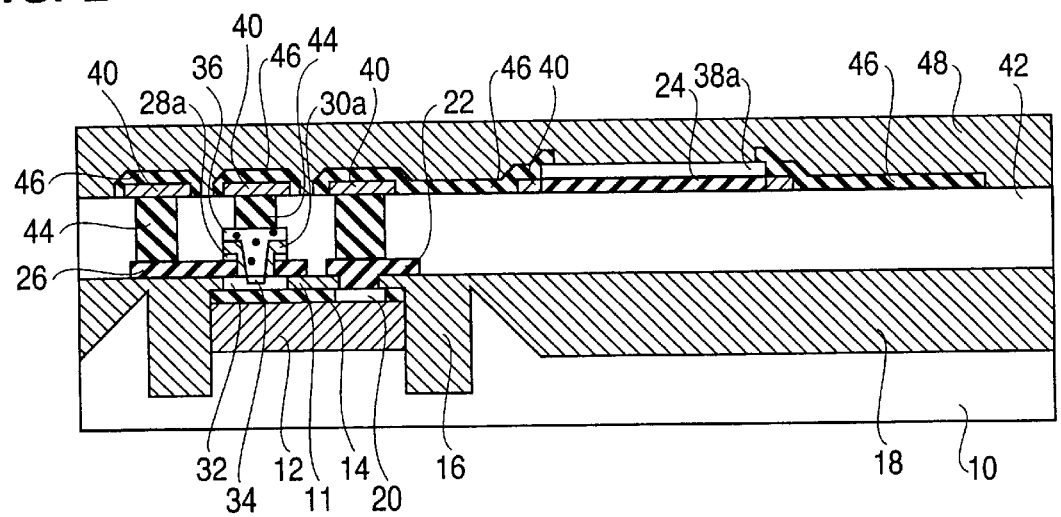
FIG. 2 is a view showing the cross-sectional structure of a semiconductor device of a second embodiment of the present invention.

FIG. 2 is a cross-sectional view showing the structure of a semiconductor device of a second embodiment of the present invention. The following is a description of the method of manufacturing a semiconductor device of a second embodiment of the present invention.

As with the first embodiment, a bipolar transistor that is the circuit element shown in the related art is formed on a p-type silicon substrate 10. Next, a silicon oxide film 42 is formed as the first insulation film on the bipolar transistor, the trench separation insulation film 16 and the field insulation film 18. A contact hole is then formed in the silicon oxide film 42 using photolithographic and etching processing. An interconnect plug 44 of, for example, tungsten is formed as the first high fusion point metal film at this contact hole. A TEG measurement pad (not shown) is also formed during formation of this interconnect plug 44 so that TEG measurements for monitoring the transistor can be made. After this, the transistor characteristics are measured using the TEG for monitoring the transistor, and a resistance that makes the output 203 of the circuit of FIG. 6 of a prescribed current or voltage is obtained. As with the first embodiment, a polysilicon film of a prescribed p-type impurity concentration and film thickness is formed on the silicon oxide film 42 including the interconnect plug 44 in such a manner as to give a prescribed sheet resistance.

In this second embodiment, after this, the resistance element 24 of a resistance set as described above using the polysilicon film is formed using photolithographic and etching processing. During this time, a polysilicon film is formed at the upper part of the interconnect plug 44 so as to cover the exposed surface of the interconnect plug 44. A silicon oxide film 38a is formed as the second insulation film on the silicon oxide film 42 including the polysilicon film that becomes the resistance element portion. A pattern for the silicon oxide film 38a covering just a prescribed portion of the resistance element 24 is then formed using photolithographic and etching processing. A Ti (titanium) film is then formed using sputtering techniques as the second high fusion point metal film on the silicon oxide film 42 including the exposed polysilicon film. The exposed surface of the polysilicon film not covered by the silicon oxide film 38a is then made into a silicide using heat treatment such as RTA (Rapid Thermal Annealling) at a temperature of approximately 700° C. As a result, a Ti silicide 40 is formed at the exposed polysilicon surface and the exposed polysilicon film is made to be of a low resistance. Unreacted Ti is then removed. The second high fusion point metal film is by no means limited to Ti, and other high fusion point metals such as Co (cobalt) etc. can also be used. Next, for example, an aluminum alloy film is formed as a metal film on the silicon oxide film 42 including the Ti silicide 40. Interconnect 46 is then formed using the aluminum alloy film using photolithographic and etching processing. An insulation film 48 is then formed as a protective film on the interconnect 46, silicon oxide film 38a and the silicon oxide film 42. This situation is shown in FIG. 2.

According to the method of this embodiment, a polysilicon pattern covering the exposed surface of the upper part of the interconnect plug 44 can be made into a silicide. The parts connecting the resistance element 24 and the interconnect 46 are also made into a silicide. The resistances of parts connecting the interconnect plug 44 and the polysilicon pattern, and the parts connecting the resistance element 24 and the interconnect 46 are therefore lower than in the related art. However, this has no influence on the setting of the impurity concentration of the resistance element 24 because the resistance element 24 is covered by the silicon oxide film 38a and there is no degeneration in the exposed surface of the upper part of the interconnect plug 44. The distance between the semiconductor substrate and the resistance element can be maintained, as in the first embodiment, and reductions in parasitic capacitance can again be obtained.

Figure 3:
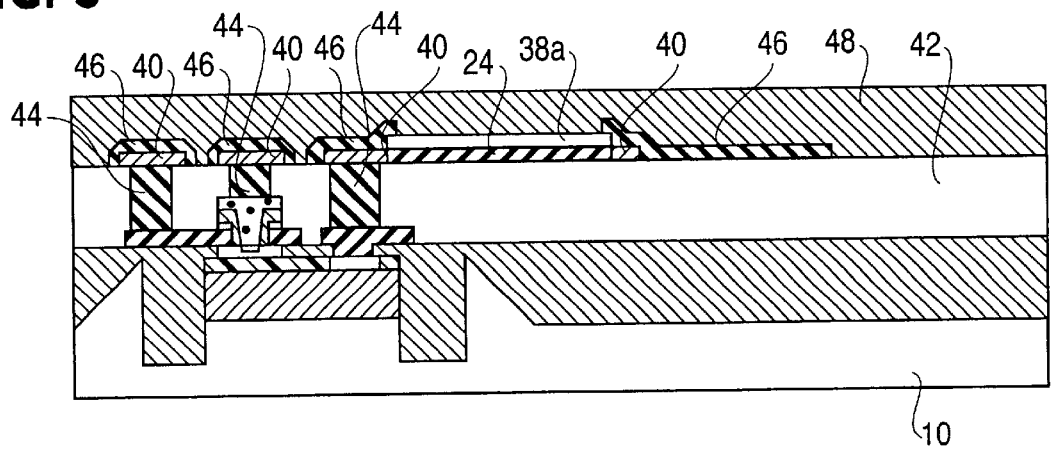
FIG. 3 is a view showing the cross-sectional structure of a semiconductor device of a third embodiment of the present invention.

FIG. 3 is a cross-sectional view showing the structure of a semiconductor device of a third embodiment of the present invention. Differences with the structure of the semiconductor device of the second embodiment of the present invention are as follows. In the second embodiment, interconnect 46 is formed at parts connecting the resistance element 24 and the collector lead-out electrode 22 but in this embodiment connecting parts that have been made into silicides can be formed at the upper part of the interconnect plug 44 at the resistance element 24.

According to the configuration of this embodiment, the length, in the direction of a horizontal plane, of the interconnect component connecting the interconnect plug 44 and the resistance element 24 can be made shorter by connecting the interconnect plug 44 and a Ti silicide part 40 of the polysilicon film. Parasitic capacitance between the p-type silicon substrate 10 and the interconnect 46 can therefore be reduced as a result of shortening the interconnect 46. The size of the element can therefore be reduced as a result of making the space for forming interconnect in the horizontal plane smaller than for the related art.

Figure 4:
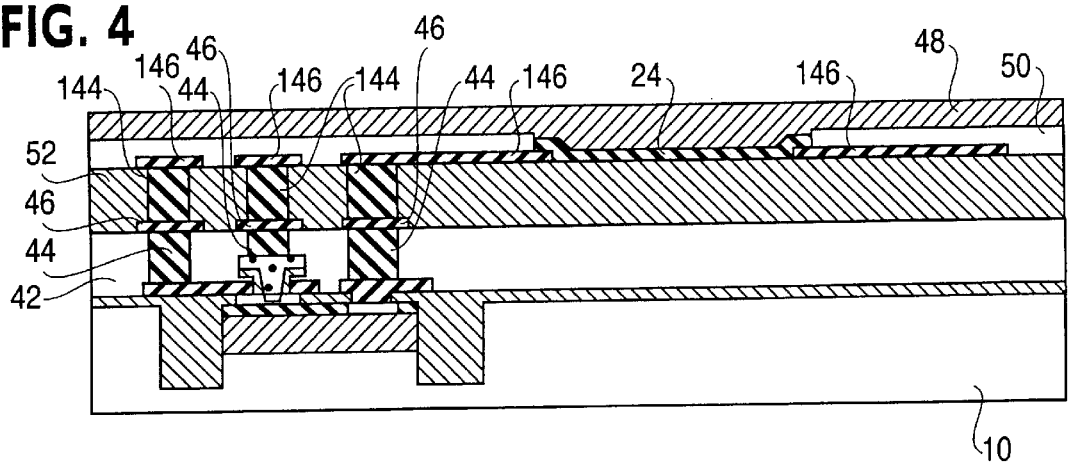
FIG. 4 is a view showing the cross-sectional structure of a semiconductor device of a fourth embodiment of the present invention.
Figure 5A:
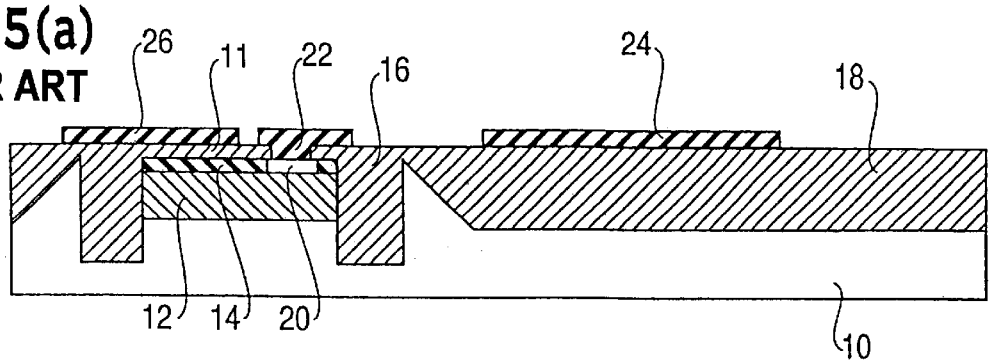
FIG. 5(a) through FIG. 5(d) are cross-sectional views showing the flow of a related method for manufacturing a semiconductor device.
Figure 5B:
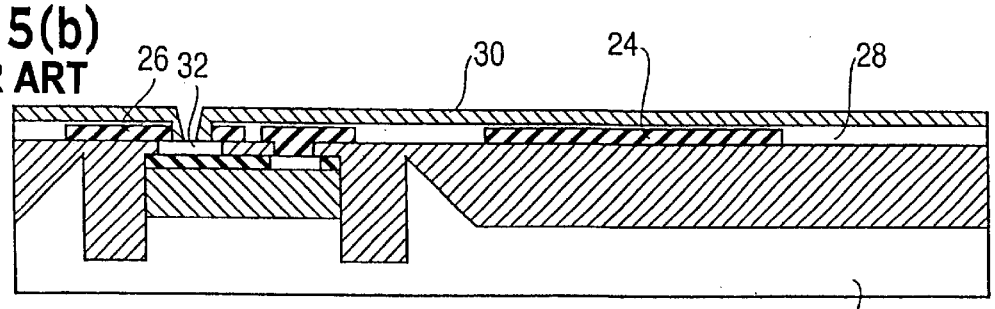
Figure 5C:
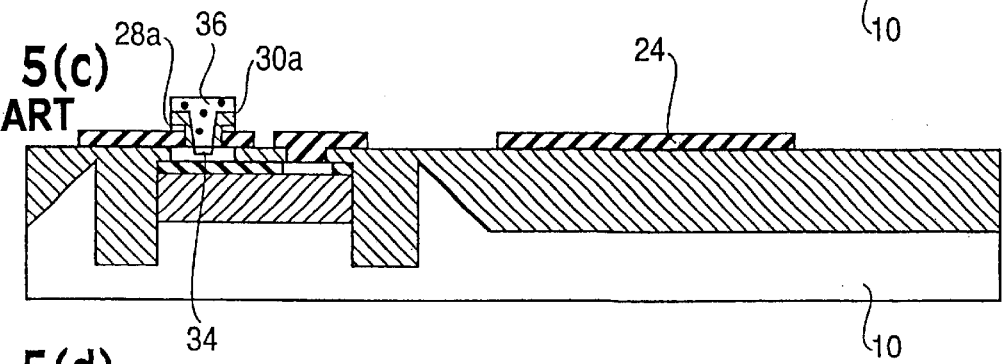
Figure 5D:
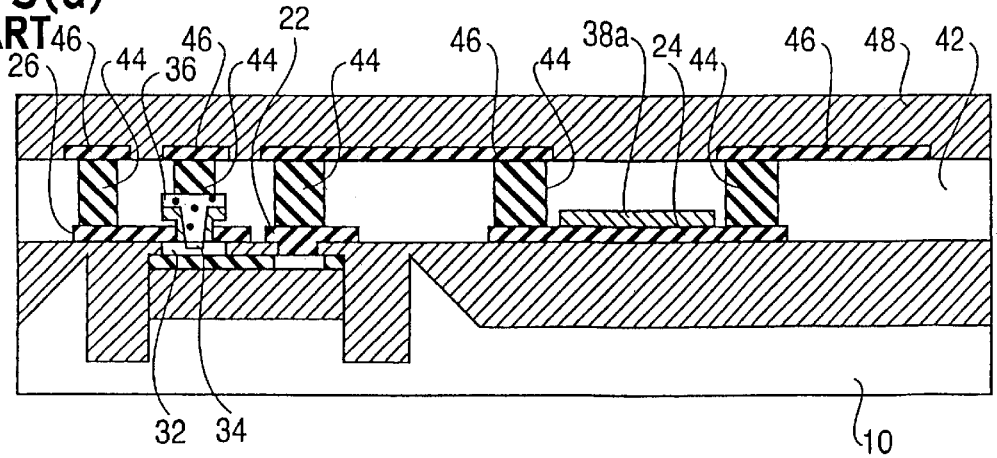

FIG. 4 is a cross-sectional view showing the structure of a semiconductor device of a fourth embodiment of the present invention. An example of a semiconductor device of a multi-layer interconnect structure, having first and second interconnect plugs 44 and 144, respectively, is shown in FIG. 4. In this embodiment, the silicon oxide films 42 and 52 are layered on an oxide film formed on the surface of the p-type silicon substrate 10 and a resistance element 24 is formed on the silicon oxide film 52. The position of this resistance element 24 from the p-type silicon substrate 10 can be kept further away in the vertical direction with respect to the surface of the p-type silicon substrate 10. Parasitic capacitance between the interconnect 146 and the p-type silicon substrate 10 can therefore be reduced. As shown in FIG. 4, parasitic capacitance can be kept sufficiently small in this embodiment even if the field insulation film is not formed, although the field insulation film can still be formed. In addition to just the silicon oxide film 42 and the silicon oxide film 52, an insulation film can also be layered on top of these two films.

What is claimed is:

1. A method for manufacturing a semiconductor device comprising:
    forming a transistor on a semiconductor substrate;
    forming a device isolation layer in a surface of the semiconductor substrate;
    forming a first insulation film covering the transistor;
    forming a contact hole for connecting an electrode of the transistor in the first insulation film;
    forming an interconnect plug within the contact hole;
    forming an interconnect pattern on the first insulation film, wherein a portion of the interconnect pattern is contacted with the interconnect plug;
    forming a second insulation film covering the interconnect pattern;
    forming an opening at the second insulation film in such a manner that part of the interconnect pattern and part of the upper surface of the first insulation film are exposed;
    forming a polysilicon film of a prescribed conductive impurity concentration on the exposed part of the interconnect pattern and the exposed part of the upper surface of the first insulation film; and
    forming a third insulation layer on the polysilicon film.

2. The method for manufacturing a semiconductor device of claim 1, wherein the polysilicon film is formed using CVD techniques in such a manner as to control film thickness and impurity.

3. The method of manufacturing a semiconductor device of claim 2, wherein the transistor is a bipolar transistor.

4. The method of manufacturing a semiconductor device of claim 1, wherein film thickness and impurity concentration of the polysilicon film are set based on results of measurements taken of characteristics of the transistor prior to forming the polysilicon film.

5. The method of manufacturing a semiconductor device of claim 4, wherein the transistor is a bipolar transistor.

6. The method of manufacturing a semiconductor device of claim 1, wherein the transistor is a bipolar transistor.

7. A method of manufacturing a semiconductor device comprising the steps of:
    forming a circuit element on a semiconductor substrate;
    forming a first insulation film covering the circuit element;
    forming a contact hole for connecting an electrode of the circuit element in the first insulation film;
    forming an interconnect plug within the contact hole using a first high fusion point metal film;
    forming a polysilicon film of a prescribed conductive impurity concentration and film thickness covering the upper surface of the interconnect plug and the upper surface of first insulation film;
    forming a prescribed pattern using the polysilicon film;
    forming a second insulation film partially covering the polysilicon film;
    forming a second high fusion point metal film at an exposed surface of the polysilicon film;
    making the exposed surface of the polysilicon film low resistance using heat treatment; and
    forming a prescribed interconnect pattern of a metal film covering an exposed portion of the resistance-lowered polysilicon film and extending over the first insulation film.

8. The semiconductor device manufacturing method of claim 7, wherein the circuit element is a bipolar transistor.

9. The semiconductor device manufacturing method of claim 7, wherein the polysilicon film is formed using CVD techniques in such a manner as to control film thickness and impurity concentration of the polysilicon film.

10. The semiconductor device manufacturing method of claim 9, wherein film thickness and impurity concentration of the polysilicon film can be set based on results of measurements taken of characteristics of the circuit element prior to forming the polysilicon film.

11. The semiconductor device manufacturing method of claim 10, wherein the circuit element is a bipolar transistor.

12. The semiconductor device manufacturing method of claim 9, wherein the circuit element is a bipolar transistor.

13. A method for manufacturing a semiconductor device comprising;
    preparing a semiconductor substrate:
    forming a device isolation layer on a surface of the semiconductor substrate, wherein the device isolation layer defines an active region;
    forming a transistor in the active region of the semiconductor substrate;
    forming a first insulating layer on the transistor and the device isolation layer;
    forming a contact hole in the first insulating layer, wherein the contact hole is located above the transistor;
    depositing a conductive material in the contact hole, wherein the contact hole is filled with the conductive material;
    forming a conductive line having a first end and a second end on the first insulating layer, wherein the first end of the conductive line is connected to the conductive material and wherein the conductive line extends over the first insulating layer;
    forming a resistive layer on the first insulating layer, wherein the resistive layer is connected to the second end of the conductive line; and
    forming a second insulating layer on the resistive layer.

14. The method according to claim 13, wherein the conductive material and the conductive line are comprised of a refractory metal, and the resistive layer is comprised of silicon.

15. The method according to claim 14, further comprising:
forming a reacted layer between the conductive line and the resistive layer by heat treatment, wherein the reacted layer is composed of silicon and a refractory metal.

16. The method according to claim 15, wherein the conductive material is comprised of tungsten and wherein the resistive element is comprised of polycrystalline silicon.

17. The method according to claim 13, further comprising covering the conductive line with a silicon nitride layer.

18. The method according to claim 13, wherein the resistive element is located above the device isolation layer.

19. A method for fabricating a semiconductor device including a bipolar transistor having first, second and third electrodes, and including a resistive element connected to the bipolar transistor, comprising:
forming an intermediate insulating layer on the bipolar transistor;
forming first, second and third contact holes in the intermediate insulating layer, wherein the first, second and third contact holes are respectively aligned with the first, second and third electrodes of the bipolar transistor;
filling the first, second and third contact holes with a conductive material;
forming first, second and third conductive lines on the intermediate insulating layer, wherein the first, second and third conductive lines are respectively connected to the conductive material of the first, second and third contact holes;
forming a first insulating layer on the first, second and third conductive lines so as to expose a portion of the first conductive line; forming a resistive layer on the intermediate insulating layer so as to connect to the exposed portion of the first conductive line; and
covering the resistive layer with a second insulating layer.

20. The method according to claim 19, wherein said forming an intermediate insulating layer comprises:
forming a first silicon oxide layer on the bipolar transistor; and
forming a second silicon oxide layer on the first silicon oxide layer.

21. A method of manufacturing a semiconductor device comprising:
forming a circuit element on a semiconductor substrate;
forming a first insulation film covering the circuit element;
forming a contact hole in the first insulation film through to an electrode of the circuit element;
forming an interconnect plug within the contact hole;
forming an interconnect pattern on the first insulation film using a high fusion point metal film;
forming a second insulation film covering the interconnect pattern;
forming an opening in the second insulation film so that an upper surface of the interconnect pattern and a part of an upper surface of the first insulation film are exposed; and
forming a polysilicon film of a prescribed conductive impurity concentration and film thickness covering and extending on the exposed upper surface of the interconnect pattern and the part of the upper surface of the first insulation film.

* * * * *